United States Patent
Tennant et al.

(10) Patent No.: US 9,685,477 B2
(45) Date of Patent: Jun. 20, 2017

(54) TWO-TERMINAL MULTI-MODE DETECTOR

(71) Applicant: TELEDYNE SCIENTIFIC & IMAGING, LLC, Thousand Oaks, CA (US)

(72) Inventors: William E. Tennant, Thousand Oaks, CA (US); Donald L. Lee, Thousand Oaks, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 14/493,092

(22) Filed: Sep. 22, 2014

(65) Prior Publication Data

US 2016/0087001 A1    Mar. 24, 2016

(51) Int. Cl.
| | | |
|---|---|---|
| *H01L 31/00* | (2006.01) | |
| *H01L 27/146* | (2006.01) | |
| *H01L 31/103* | (2006.01) | |
| *H01L 31/18* | (2006.01) | |
| *H01L 31/02* | (2006.01) | |

(52) U.S. Cl.
CPC .. *H01L 27/14669* (2013.01); *H01L 27/14649* (2013.01); *H01L 31/02005* (2013.01); *H01L 31/1032* (2013.01); *H01L 31/1832* (2013.01)

(58) Field of Classification Search
CPC ........... H01L 27/14669; H01L 27/1464; H01L 31/1032; H01L 31/1832; H01L 25/043
USPC .................................. 257/186, 188, 440, 442
See application file for complete search history.

(56) References Cited

U.S. PATENT DOCUMENTS

| | | | |
|---|---|---|---|
| 5,373,182 A | 12/1994 | Norton | 257/440 |
| 5,457,331 A * | 10/1995 | Kosai | H01L 25/043 |
| | | | 257/188 |
| 6,034,407 A | 3/2000 | Tennant et al. | 257/440 |
| 6,657,194 B2 | 12/2003 | Ashokan et al. | 250/338.4 |

(Continued)

OTHER PUBLICATIONS

Arias et al., 'Planar p-on-n HgCdTe heterostructure photovoltaic detectors', Appl. Phys. Lett. 62, 976 1993.*

*Primary Examiner* — Reema Patel
*Assistant Examiner* — Syed Gheyas
(74) *Attorney, Agent, or Firm* — Koppel, Patrick, Heybl & Philpott

(57) ABSTRACT

A two-terminal detector has a back-to-back p/n/p SWIR/ MWIR stack structure, which includes P-SWIR absorber, N-SWIR, wide bandgap bather, N-MWIR absorber, and P-MWIR layers, with contacts on the P-MWIR and P-SWIR layers. The junction between the SWIR layers and the junction between the MWIR layers are preferably passivated. The detector stack is preferably arranged such that a negative bias applied to the top of the stack reverse-biases the MWIR junction and forward-biases the SWIR junction, such that the detector collects photocurrent from MWIR radiation. A positive bias forward-biases the MWIR junction and reverse-biases the SWIR junction, such that photocurrent from SWIR radiation is collected. A larger positive bias induces electron avalanche at the SWIR junction, thereby providing detector sensitivity sufficient to provide low light level passive amplified imaging. Detector sensitivity in this mode is preferably sufficient to provide high resolution 3-D eye-safe LADAR imaging.

13 Claims, 1 Drawing Sheet

(56) References Cited

U.S. PATENT DOCUMENTS

| | | | |
|---|---|---|---|
| 7,491,938 B2 | 2/2009 | Geneczko et al. | 250/339.02 |
| 7,608,823 B2 * | 10/2009 | Tennant | H01L 27/1465 250/208.1 |
| 7,608,906 B2 * | 10/2009 | Tennant | H01L 27/1464 257/186 |
| 8,610,171 B2 | 12/2013 | Bois et al. | 257/189 |
| 2002/0125472 A1 | 9/2002 | Johnson et al. | 257/21 |
| 2007/0029485 A1 * | 2/2007 | Beck | H01L 31/02027 250/338.4 |
| 2007/0063219 A1 * | 3/2007 | Sa'ar | B82Y 20/00 257/189 |
| 2011/0031401 A1 * | 2/2011 | Mitra | H01L 31/02966 250/338.4 |
| 2011/0062329 A1 | 3/2011 | Ben-Bassat | 250/330 |
| 2011/0062330 A1 | 3/2011 | Ben-Bassat | 250/330 |
| 2011/0062333 A1 | 3/2011 | Ben-Bassat | 250/332 |
| 2011/0062334 A1 | 3/2011 | Ben-Bassat | 250/332 |
| 2011/0062336 A1 | 3/2011 | Ben-Bassat | 250/338.4 |

\* cited by examiner

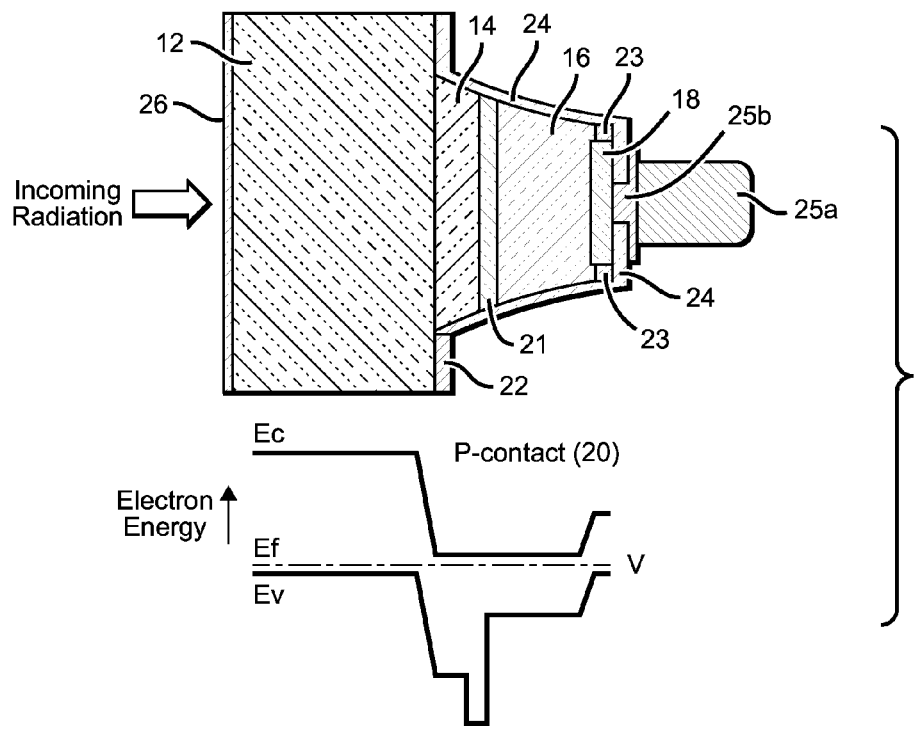
FIG. 1
FIG. 2
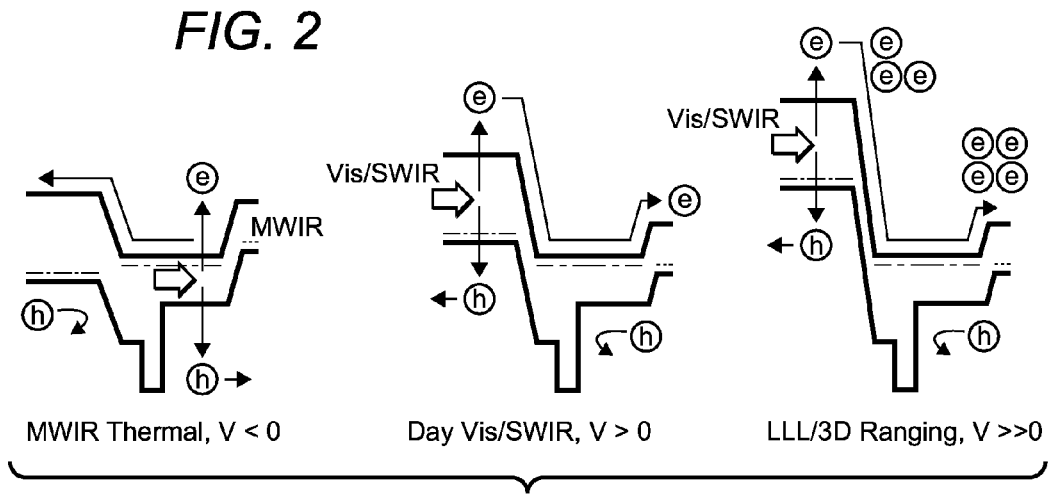

9,685,477 B2

TWO-TERMINAL MULTI-MODE DETECTOR

BACKGROUND OF THE INVENTION

Field of the Invention

This invention relates generally to photodetectors, and more particularly to a detector architecture which enables co-located and near simultaneous operation in multiple modes.

Description of the Related Art

Conventional imaging systems that employ photodetectors are typically designed to operate in a pre-defined portion of the spectrum. For example, an imaging system might be designed to perform thermal imaging in the mid-wavelength infrared (MWIR) band. Another system could be arranged for imaging in the visible/short-wavelength IR (Vis/SWIR) portion of the spectrum, and yet another designed to provide low light level (LLL) night imaging.

All of the above functions have been demonstrated using individual imaging systems within the past few years. For example, single color MWIR n-on-p or p-on-n thermal imaging is a standard product throughout the IR industry. Several companies, such as Raytheon Vision Systems (RVS) and Selex, have demonstrated dual-band imagers which use an n/p/n architecture grown by MBE and MOCVD, respectively. Several companies, including RVS and BAE Systems, have generated so-called e-APDs using p-on-n material for LADAR and LLL applications.

In some applications, however, it would be highly preferred to have a single imaging system capable of providing data for all of the bands mentioned above. Heretofore, providing high performance across all of these bands requires the use of multiple focal plane arrays (FPAs), readout ICs (ROICs) and a complex optics train. However, this approach is costly and requires a large amount of area, and may be prone to reliability issues in view of the multiple independent systems needed.

SUMMARY OF THE INVENTION

A two-terminal multi-mode detector is presented which addresses several of the problems noted above, providing a means for co-located and near-simultaneous MWIR thermal imaging, high-resolution eye-safe laser ranging (3-D imaging) and large dynamic range active/passive detection in the VIS-SWIR spectral regions for combined LLL night plus day imaging. This functionality is achieved with a single focal plane, preferably grown epitaxially by MBE, without need for multiple image planes, ROICs and a complex optics train.

The present two-terminal detector has a back-to-back p/n/p SWIR/MWIR detector stack structure. The stack includes, in sequence, a P-SWIR absorber layer, an N-SWIR layer, an N-MWIR absorber layer, and a P-MWIR layer, with a first contact on the P-MWIR layer and a second contact on the P-SWIR absorber layer. The structure also includes a wide bandgap bather layer between the N-SWIR layer and the N-MWIR layer. The device can include a substrate below the P-SWIR absorber layer (i.e., on the side of the P-SWIR layer opposite the N-SWIR layer), or the substrate may be removed. The detector's layers preferably comprise HgCdTe, with both SWIR and MWIR p-n junctions preferably passivated with CdTe using molecular beam epitaxy (MBE).

The detector stack is preferably arranged such that:
when a negative bias of a predetermined magnitude is applied to the top of the stack such that the junction between the P-MWIR layer and the N-MWIR absorber layer is reverse-biased and the junction between the P-SWIR absorber layer and the N-SWIR layer is forward-biased, the detector collects photocurrent from MWIR radiation;
when a positive bias of a predetermined magnitude is applied to the top of the stack such that the junction between the P-MWIR layer and the N-MWIR absorber layer is forward-biased and the junction between the P-SWIR absorber layer and the N-SWIR layer is reverse-biased, the detector collects photocurrent from SWIR radiation; and
applying a positive bias of predetermined magnitude to the top of the stack induces electron avalanche at the junction between the P-SWIR absorber layer and the N-SWIR layer, such that the detector's sensitivity is sufficient to provide LLL passive amplified imaging. Detector sensitivity in this mode is preferably sufficient to provide high resolution 3-D eye-safe LADAR imaging.

These and other features, aspects, and advantages of the present invention will become better understood with reference to the following drawings, description, and claims.

BRIEF DESCRIPTION OF THE DRAWINGS

FIG. 1 is a sectional view of a two-terminal detector per the present invention.

FIG. 2 depicts energy band diagrams for a detector per the present invention when operated under three different operating modes.

DETAILED DESCRIPTION OF THE INVENTION

The present two-terminal detector provides a single FPA that can perform:

MWIR thermal imaging;
high resolution 3-D eye-safe LADAR imaging; and
large dynamic range active/passive detection in the Vis/SWIR spectral region for combined LLL night plus day imaging. These capabilities are provided using a stacked p/n/p SWIR/MWIR two-terminal structure, with the various imaging modes selected by choice of detector bias polarity and bias voltage.

One possible embodiment of a two-terminal detector per the present invention is shown in FIG. 1, which also shows an energy band diagram for the detector with no bias applied (and with conduction band $E_C$, valence band $E_V$ and Fermi level $E_F$ labeled). The detector 10 consists of a back-to-back p/n/p SWIR/MWIR detector stack. Looking at the stack from left to right, the first layer 12 is a p-type SWIR (P-SWIR) absorber layer. An n-type SWIR layer (N-SWIR) layer 14 is on P-SWIR absorber layer 12. An n-type MWIR (N-MWIR) absorber layer 16 is on N-SWIR layer 14, and a P-MWIR layer 18 is on the N-MWIR absorber layer. A first contact 20 is on P-MWIR layer 18 and a second contact 22 is on P-SWIR absorber layer 12. The SWIR band (layers 12 and 14) and the MWIR band (layers 16 and 18) are separated by a wide bandgap barrier layer 21 to eliminate spectral crosstalk.

The detector stack is preferably grown using molecular beam epitaxy (MBE), preferably using in-situ indium doping for the n-regions (14, 16). P-SWIR absorber layer 12 is preferably p-doped using in-situ arsenic (As).

The P-MWIR layer 18, and thus MWIR junction at the interface between layers 16 and 18, is preferably formed with an As-implantation step. The implantation is preferably performed through a wide bandgap N-type cap 23 using, for example, a double-layer planar heterojunction (DLPH) process. Alternatively, P-MWIR layer 18 can be grown in-situ with As-doping, with the MWIR junction delineated by wet or dry mesa etching (not shown). The SWIR junction is preferably delineated by wet or dry mesa etching, passivated with cadmium telluride (CdTe) and over-coated with a dielectric 24 such as $Si_3N_4$ as an encapsulant. The MWIR junction is also preferably passivated with CdTe and over-coated with dielectric 24. Passivation of both the SWIR and MWIR junctions is preferably done by MBE.

Contact 20 preferably consists of a single indium bump 25a on top of a p-type contact metal 25b, which would typically provide an electrical contact to a readout IC (ROIC) input cell. Contact 22 is made to P-SWIR absorber layer 12, and may serve as a common contact which also connects to ROIC 'common' through an additional set of indium bumps located around the periphery of the detector array (not shown).

The present detector would typically be fabricated on a substrate (not shown); the completed device may include the substrate, or the substrate may be removed (as shown in FIG. 1). Removing the substrate can enable the response of the SWIR band to be extended to the visible. The resulting 'backside' 26 is preferably passivated, preferably by MBE, though other techniques—such as evaporation—could also be used. The substrate, as well as SWIR and MWIR layers 12, 14, 16 and 18, and barrier layer 21 preferably comprise mercury cadmium telluride (HgCdTe).

The structure described above is capable of being fabricated into two-dimensional detector arrays using standard processing methods common to HgCdTe fabrication, and of being hybridized to standard ROICs to form a focal plane array (FPA). The FPA could then be incorporated into, for example, an integrated Dewar-cooler assembly (IDCA) and subsequently into a camera to provide imagery functions in the operating modes described below.

The present detector can be operated in different modes simply by controlling the polarity and amplitude of the bias voltage applied across terminals 20 and 22. Under one polarity bias, the detector collects photo-current from MWIR thermal radiation incident upon it. With a low bias in the reverse polarity, the detector collects photo-current from SWIR and optionally visible radiation. With a larger reverse-bias of the same polarity, electron avalanche is induced allowing for near-noiseless gain of LLL passive amplified night imaging and high-resolution 3-D eye-safe (e.g., 1.3 µm) LADAR. The bias voltages needed for proper operation in each mode are preferably pre-determined, to simplify the task of switching between operating modes.

The operating modes of the detector stack are illustrated in the energy band diagrams shown in FIG. 2. The leftmost energy diagram shows operation in the MWIR Thermal Imaging mode. A small negative bias is applied to the top of the stack (i.e., such that contact 20 is negative with respect to contact 22). This has the effect of reverse-biasing the MWIR junction (interface between layers 16 and 18) and forward-biasing the SWIR junction (interface between layers 12 and 14). Under these conditions, and because the SWIR bandgap is too large to absorb MWIR, MWIR radiation passes through SWIR absorber layer 12 (actually a Vis/SWIR absorber layer with the substrate removed) and is collected in the MWIR band (layers 16 and 18). P-SWIR absorber layer 12 is designed to be sufficiently thick to minimize optical penetration of Vis/SWIR radiation into the MWIR region and hence minimize spectral crosstalk. Injection of holes from the forward-biased SWIR junction is also prevented by the large valence band offset created by barrier layer 21. Radiative recombination in the n-region (14) of the SWIR band and subsequent optical radiation into the MWIR band can be reduced by: 1) increasing the n-side doping of the SWIR band such that radiative lifetime is reduced, and 2) minimizing the thickness of n-layer 14.

The energy diagram in the center of FIG. 2 illustrates operation in the Vis/SWIR Imaging mode. A small positive bias is applied to the top of the stack (i.e., such that contact 20 is positive with respect to contact 22). This has the effect of forward-biasing the MWIR junction and reverse-biasing the SWIR junction. This results in SWIR radiation (and visible radiation if the substrate has been removed) being collected in the SWIR band (layers 12 and 14). MWIR radiation absorbed in the longer wavelength band layer is not collected, due to the large valence band offset of barrier layer 21—which also prevents the injection of holes into the Vis/SWIR diode (layers 12 and 14) from the forward-biased MWIR junction.

The rightmost energy diagram shows operation in the LLL passive amplified mode. Here, a sufficiently large positive bias is applied to the top of the stack, such that electron avalanche is induced in the SWIR junction. This provides gain for the detector, increasing the detector's sensitivity such that it is sufficient for LLL passive amplified night imaging. This mode could also be employed in a laser ranging application; for example, the present detector could be arranged to provide high-resolution 3-D eye-safe (1.3 µm) LADAR imaging. This is facilitated by the unique near noise-free (noise factor=1) electron avalanche (e-APD) properties of HgCdTe, which have been well-modeled in the literature.

The present two-terminal detector provides co-located and near-simultaneous MWIR thermal imaging, high resolution eye-safe LADAR imaging and large dynamic range active/passive detection in the Vis/SWIR spectral regions for combined low light level night plus day imaging. This functionality is achieved in a single focal plane, preferably grown epitaxially by MBE, without compromising performance and without the need for multiple image planes, ROICs and complex optics train.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A two-terminal detector, comprising:
   a P-SWIR absorber layer;
   an N-SWIR layer on said P-SWIR absorber layer;
   a wide bandgap barrier layer on said N-SWIR layer;
   an N-MWIR absorber layer on said wide bandgap barrier layer;
   a P-MWIR layer on said N-MWIR absorber layer;
   a first contact on said P-MWIR layer; and
   a second contact on said P-SWIR absorber layer;
   wherein the junctions between said P-SWIR absorber layer and said N-SWIR layer and between said N-MWIR absorber layer and said P-MWIR layer are passivated using molecular beam epitaxy (MBE);
   a layer of silicon nitride overcoating said passivated junctions;
   such that said layers and contacts form a back-to-back p/n/p SWIR/MWIR detector stack;

said detector stack arranged such that:

when a negative bias of a predetermined magnitude is applied to the top of said stack such that the junction between said P-MWIR layer and said N-MWIR absorber layer is reverse-biased and the junction between said P-SWIR absorber layer and said N-SWIR layer is forward-biased, said detector collects photocurrent from MWIR radiation;

when a positive bias of a predetermined magnitude is applied to the top of said stack such that the junction between said P-MWIR layer and said N-MWIR absorber layer is forward-biased and the junction between said P-SWIR absorber layer and said N-SWIR layer is reverse-biased, said detector collects photocurrent from SWIR radiation; and applying a positive bias of a predetermined magnitude to the top of said stack induces electron avalanche at the junction between said P-SWIR absorber layer and said N-SWIR layer, such that said detector's sensitivity is sufficient to provide low light level passive amplified imaging.

2. The detector of claim 1, wherein said P-MWIR layer is an arsenic implant.

3. The detector of claim 2, further comprising an N-type wide bandgap cap through which said implant is performed.

4. The detector of claim 1, further comprising a substrate on the side of said P-SWIR absorber layer opposite said N-SWIR layer.

5. The detector of claim 1, wherein the side of said P-SWIR absorber layer opposite said N-SWIR layer is said detector's backside, said backside being passivated.

6. The detector of claim 5, wherein said backside is passivated using molecular beam epitaxy (MBE) or evaporation.

7. The detector of claim 1, wherein said layers comprise HgCdTe.

8. The detector of claim 1, wherein said junctions are passivated with CdTe.

9. The detector of claim 1, wherein said detector further collects photocurrent from visible radiation.

10. The detector of claim 1, wherein said detector sensitivity is sufficient to provide high resolution 3-D eye-safe LADAR imaging.

11. The detector of claim 1, wherein said first contact is an indium bump on a p-type contact metal.

12. The detector of claim 1, said first contact comprising:
a p-type contact metal, at least a portion of which is in a gap in said dielectric layer; and
an indium bump on said p-type contact metal.

13. A focal plane array, comprising:
an array of 2-terminal detectors, each of which comprises:
a P-SWIR absorber layer;
an N-SWIR layer on said P-SWIR absorber layer;
a wide bandgap barrier layer on said N-SWIR layer;
an N-MWIR absorber layer on said wide bandgap barrier layer;
a P-MWIR layer on said N-MWIR absorber layer;
a first contact on said P-MWIR layer; and
a second contact on said P-SWIR absorber layer;
wherein the junctions between said P-SWIR absorber layer and said N-SWIR layer and between said N-MWIR absorber layer and said P-MWIR layer are passivated using molecular beam epitaxy (MBE), said passivated junctions overcoated with a dielectric;
such that said layers and contacts form a back-to-back p/n/p SWIR/MWIR detector stack, the N-SWIR, wide bandgap barrier, N-MWIR, and P-MWIR layers of said stack forming first and second sides, said P-SWIR absorber layer extending beyond said first and second sides, said second contact being on a portion of said P-SWIR absorber layer that extends beyond said first side and said dielectric overcoat extending along a portion of said P-SWIR absorber layer that extends beyond said second side;

said detector stack arranged such that:

when a negative bias of a predetermined magnitude is applied to the top of said stack such that the junction between said P-MWIR layer and said N-MWIR absorber layer is reverse-biased and the junction between said P-SWIR absorber layer and said N-SWIR layer is forward-biased, said detector collects photocurrent from MWIR radiation;

when a positive bias of a predetermined magnitude is applied to the top of said stack such that the junction between said P-MWIR layer and said N-MWIR absorber layer is forward-biased and the junction between said P-SWIR absorber layer and said N-SWIR layer is reverse-biased, said detector collects photocurrent from SWIR radiation; and applying a positive bias of a predetermined magnitude to the top of said stack induces electron avalanche at the junction between said P-SWIR absorber layer and said N-SWIR layer, such that said detector's sensitivity is sufficient to provide low light level passive amplified imaging; and at least one readout IC (ROIC) hybridized to said array of detectors.

* * * * *